United States Patent
Nam et al.

(10) Patent No.: US 7,545,182 B2
(45) Date of Patent: Jun. 9, 2009

(54) CASCODE-TYPE CURRENT MODE COMPARATOR AND RECEIVER, AND SEMICONDUCTOR DEVICE HAVING THE SAME

(75) Inventors: Jan-Jin Nam, Yongin-si (KR); Yong-Weon Jeon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/700,117

(22) Filed: Jan. 31, 2007

(65) Prior Publication Data

US 2007/0176646 A1 Aug. 2, 2007

(30) Foreign Application Priority Data

Feb. 1, 2006 (KR) ............... 10-2006-0009588

(51) Int. Cl.
*H03K 5/22* (2006.01)
(52) U.S. Cl. .................. 327/77; 327/87; 327/88
(58) Field of Classification Search ............ 327/77, 327/87, 88
See application file for complete search history.

(56) References Cited

U.S. PATENT DOCUMENTS

| 5,781,043 A * | 7/1998 | Slemmer ............ 327/78 |
| 7,170,329 B2 * | 1/2007 | Tseng et al. ......... 327/205 |

FOREIGN PATENT DOCUMENTS

| JP | 07-135452 | 5/1995 |
| JP | 2000-188517 | 7/2000 |
| JP | 2001-016078 | 1/2001 |
| JP | 2004-064273 | 2/2004 |

* cited by examiner

*Primary Examiner*—Kenneth B. Wells
(74) *Attorney, Agent, or Firm*—Harness, Dickey & Pierce, PLC

(57) ABSTRACT

A current mode comparator for a semiconductor device is disclosed. The current mode comparator may include a logic circuit coupled to a voltage sensing node, a first cascode coupled to the voltage sensing node and a first power node, and a second cascode coupled to the voltage sensing node and a second power node. The logic circuit may convert a voltage of the voltage sensing node to an output signal.

20 Claims, 5 Drawing Sheets

CASCODE-TYPE CURRENT MODE COMPARATOR AND RECEIVER, AND SEMICONDUCTOR DEVICE HAVING THE SAME

PRIORITY STATEMENT

This application claims priority under 35 U.S.C. § 119 to Korean Patent Application No. 10-2006-0009588, filed on Feb. 1, 2006, in the Korean Intellectual Property Office (KIPO), the entire contents of which is incorporated herein by reference.

BACKGROUND

1. Field

Example embodiments relate to semiconductor devices, for example, to cascode-type current mode comparators which may improve signal-to-noise ratio (SNR), and a semiconductor device having the same.

2. Description of the Conventional Art

A semiconductor device may exchange data with another semiconductor device with a voltage signal and/or a current signal. When transmitting data at high speeds, a current signal may be used instead of a voltage signal. To interpret the current signal, the semiconductor device may require a current mode receiver that receives the current signal and extracts the current signal's data. The current mode receiver may use a current mode comparator that outputs CMOS level voltage signals (e.g., data) based on the difference between the received data current and a chosen reference current.

FIG. 1 is a circuit diagram of a conventional current mode receiver. A conventional current mode receiver 100 may include a signal receiving end 110 and a comparator 120. The information corresponding to input current Idata and reference current Iref is presented as a change in a voltage V1 of a node NO1. The change in the voltage V1 of the node NO1 may be converted to a CMOS level voltage signal RxData by comparator 120 which includes the two NAND gates ND1 and ND2.

The comparator 120 may further include two transistors MN and MP which may be used to limit the level of the voltage V1 of the first node NO1. The two transistors MN and MP may be operated in the saturation region. One of the two transistors may be operated according to the relative amount of the input current Idata and the reference current Iref.

If the input current Idata is less than the reference current Iref, the voltage V1 of the first node NO1 increases. For example, it may increase to a level of VDD/2, such that a voltage V2 of a node NO2 transitions to a low level and the voltage signal RxData transitions to a high level. The NMOS transistor MN may then be turned off and the PMOS transistor MP may then be turned on so that current In (a current as much as Iref minus Idata) may flow to ground via the PMOS transistor MP. The NMOS transistor MN may then be turned off so that the voltage V1 of the node NO1 is stabilized.

If the input current Idata is greater than the reference current Iref, the voltage V1 of the first node NO1 may transition to a low level. The voltage V2 of the node NO2 may then transition to a high level and the voltage signal RxData may transition to a low level. The NMOS transistor MN may be turned on and the PMOS transistor MP may be turned off so that current Ip (a current as much as Idata minus Iref) may be supplied to the first node NO1 via the NMOS transistor MN. The PMOS transistor MP may be turned off so that the voltage V1 of the first node NO1 is stabilized.

Because the DC voltage level of the node NO1 may have a theoretical range of [VSS+Vthp~VDD−Vthn] (a range reduced to a threshold voltage value of the NMOS transistor MN and the PMOS transistor MP), receipt of high speed signals may be improved compared to an example where the voltage V1 of the node NO1 has a CMOS level. However, the level of the voltage V1 of the node NO1 may actually be determined by the amount of input current and output impedance $R_{OUT}$ as shown in Equation 1.

$$\Delta V = R_{OUT} \times \Delta I = (R1 \| R2) \cdot \Delta I \approx \left( \frac{1}{g_{mn}} + \frac{1}{g_{mp}} \right) |I_{DATA} - I_{REF}| \quad \text{[Equation 1]}$$

In Equation 1, $\Delta V$ may be change in the level of the voltage V1 of the first node NO1, R1 may be the output impedance of the receiving end 110, R2 may be the input impedance of the comparator 120, $g_{mn}$ may be the transconductance of the NMOS transistor MN, and $g_{mp}$ may be the transconductance of the PMOS transistor MP.

The output impedance R1 of the receiving end 110 may be over several hundred kΩ, whereas the input impedance R2 of the comparator 120 may be $1/g_{mn}$ or $1/g_{mp}$, which may be a relatively small value of several kΩ. Thus, in a system having a low current level (e.g., several hundred microamperes (μA)), the level of the voltage V1 of the node NO1 may be less than several hundred millivolts (mV). Accordingly, the voltage margin of the NAND gate ND1 of the comparator 120 is reduced such that signal receiving at high speeds may be difficult (e.g., low voltage swing level). Another factor which may restrict the comparator 120 is that the voltage noise of the power VDD and VSS may be applied to the first node NO1 without filtering.

As described above, the conventional current mode comparator 100 may be weak in view of noise immunity due to a low voltage swing level and a low power supply rejection ratio (PSRR).

SUMMARY

Example embodiments may provide a cascode-type current mode comparator which may improve noise immunity and enhance SNR by increasing the voltage swing level and PSRR of a voltage sensing node.

Example embodiments may also provide a cascode-type current mode comparator which detects a signal in a system having a low current level.

Example embodiments may provide a current mode comparator. The current mode comparator may include a logic circuit coupled to a voltage sensing node, a first cascode coupled to the voltage sensing node and a first power node, and a second cascode coupled to the voltage sensing node and a second power node. The logic circuit may convert a voltage of the voltage sensing node to an output signal.

In an example embodiment, the output signal may be a CMOS level output signal.

In an example embodiment, the output signal may reflect a difference between a reference current and a data current.

In an example embodiment, the first cascode and the second cascode may be turned on and/or off based on the output signal.

In an example embodiment, the logic circuit may be a CMOS logic circuit.

In an example embodiment, the CMOS logic circuit may include at least two NAND gates. The output of one of the at least two NAND gates may provide the output signal.

In an example embodiment, the first cascode may supply a first current from the first power node to the voltage sensing node, and the second cascode may supply a second current from the voltage sensing node to the second power node.

In an example embodiment, the first current may be equivalent or substantially similar to the difference between a data current and a reference current, and the second current may be equivalent or substantially similar to the difference between the reference current and the data current.

In an example embodiment, the first cascode may include a first cascode current source and a first main transistor, and the second cascode may include a second cascode current source and a second main transistor.

In an example embodiment, the first cascode current source may include a PMOS transistor having a first terminal coupled to the first main transistor and a second terminal coupled to the voltage sensing node. In another example embodiment, the second cascode current source may include an NMOS transistor having a first terminal coupled to the second main transistor and a second terminal coupled to the voltage sensing node.

In an example embodiment, the first cascode current source may include a PMOS transistor having a first terminal coupled to the first main transistor and a second terminal receiving a first bias voltage. In another example embodiment, the second cascode current source may include an NMOS transistor having a first terminal coupled to the second main transistor and a second terminal receiving a second bias voltage.

According to an example embodiment, a current mode receiver may include the current mode comparator of example embodiments, and a signal receiving end coupled to the voltage sensing node of the current mode comparator.

In an example embodiment, the signal receiving end receives a reference current and a data current, and generates a sensing voltage based on a difference between the reference current and the data current.

In an example embodiment, the signal receiving end receives a reference voltage and a data current, generates a reference current from the reference voltage, and generates a sensing voltage based on a difference between the reference current and the data current.

In an example embodiment, the current mode receiver may further include a reference voltage generating circuit and a cascode bias circuit. The reference voltage generating circuit may generate a reference voltage. The cascode bias circuit may generate a first bias voltage and a second bias voltage.

In an example embodiment, the first cascode may include a PMOS transistor having a first terminal coupled to a first main transistor and a second terminal receiving the first bias voltage. In another example embodiment, the second cascode may include an NMOS transistor having a first terminal coupled to a second main transistor and a second terminal receiving the second bias voltage.

In an example embodiment, the cascode bias circuit generates a first bias current corresponding to 1/n of the reference current in response to the reference voltage, where n is a real number greater than 1. In example embodiments, the cascode bias circuit generates the first bias voltage such that a current from the first cascode corresponds to m/n of the first bias current. In example embodiments, the cascode bias circuit generates the second bias voltage such that a current from the second cascode corresponds to m/n of the first bias current. In example embodiments, m is the W/L ratio of a cascode transistor of the first cascode Mpc, and n is a real number greater than 1.

According to example embodiments, a semiconductor device may include a plurality of current mode receivers according to example embodiments.

In an example embodiment, the signal receiving end may receive a reference current and a data current, and may generate a sensing voltage based on a difference between the reference current and the data current.

In an example embodiment, the signal receiving end may receive a reference voltage and a data current. The signal receiving end may generate a reference current from the reference voltage, and a sensing voltage based on a difference between the reference current and the data current.

In an example embodiment, the current mode receiver may further include at least one reference voltage generating circuit. The reference voltage generating circuit may generate a reference voltage. In at least one example embodiment, the signal receiving end receives the reference voltage.

According to another example embodiment, a current mode comparator may include a CMOS logic circuit coupled to a voltage sensing node, converting a voltage of the voltage sensing node which reflects a difference between a reference current and a data current as a CMOS level output signal, two main transistors coupled to the voltage sensing node and turned on/off based on the output signal, a first cascode current source coupled to the first main transistor, supplying current from a first power node to the voltage sensing node, and a second cascode current source coupled to the second main transistor, and supplying current from the voltage sensing node to a second power node.

According to another example embodiment, a current mode receiver of a semiconductor device may comprise a signal receiving end coupled to a voltage sensing node, receiving reference and data currents, generating a sensing voltage based on a difference between the reference current and the data current, and a comparator converting the sensing voltage to a CMOS level output signal.

According to another example embodiment, a semiconductor device may comprise a plurality of current mode receivers. The plurality of current mode receivers may receive a data current from a plurality of channels and may generate an output signal. Each of the plurality of current mode receivers may comprise the signal receiving end and/or the comparator.

Example embodiments will be more apparent from the following detailed description, the accompanying drawings, and the associated claims.

BRIEF DESCRIPTION OF THE DRAWINGS

Example embodiments will become more apparent by describing them with reference to the attached drawings in which.

Figure 1:
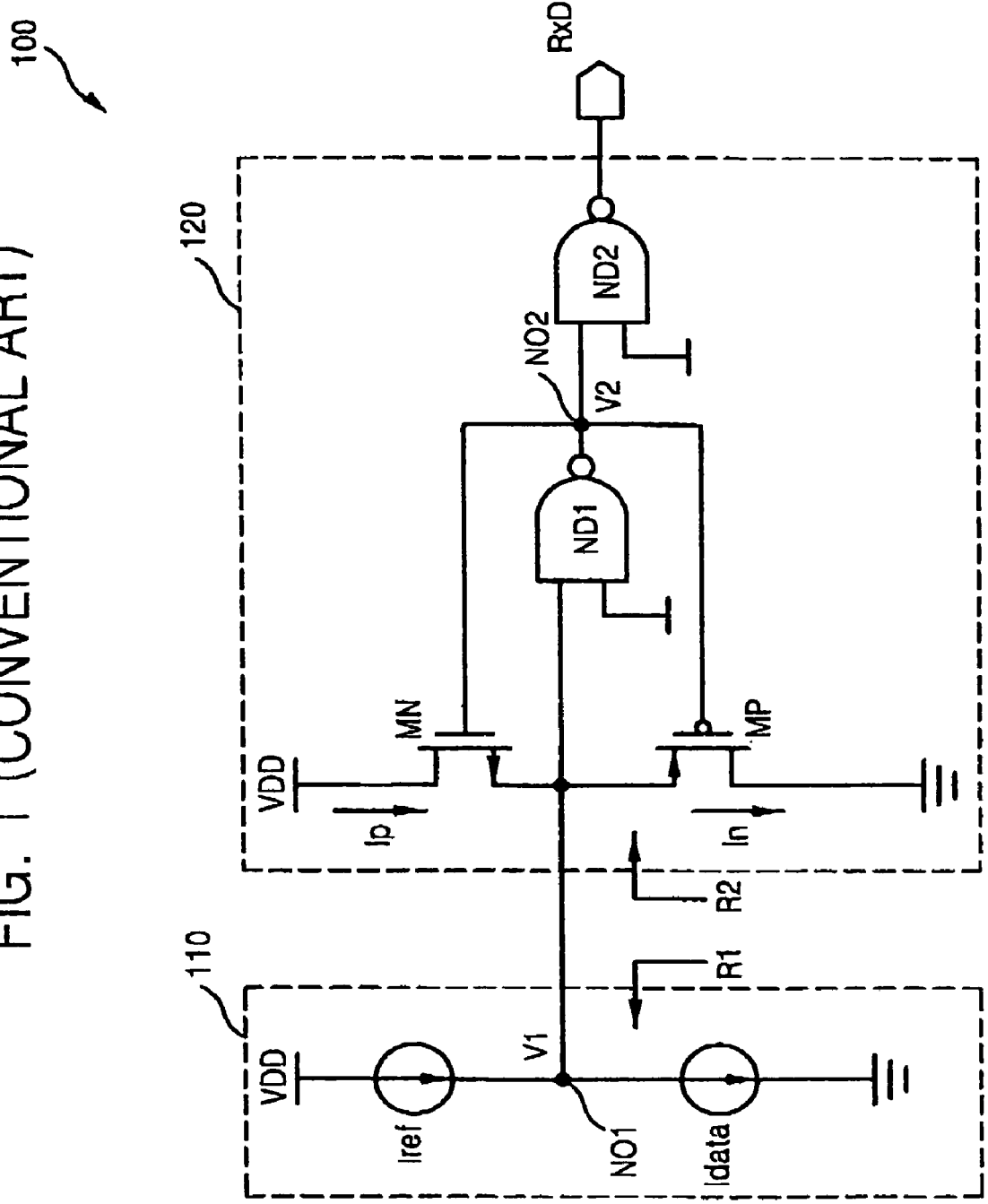
FIG. 1 is a circuit diagram of a conventional current mode receiver.

The accompanying drawings are intended to depict example embodiments and should not be interpreted to limit the scope thereof. The accompanying drawings are not to be considered as drawn to scale unless explicitly noted.

DETAILED DESCRIPTION OF EXAMPLE EMBODIMENTS

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
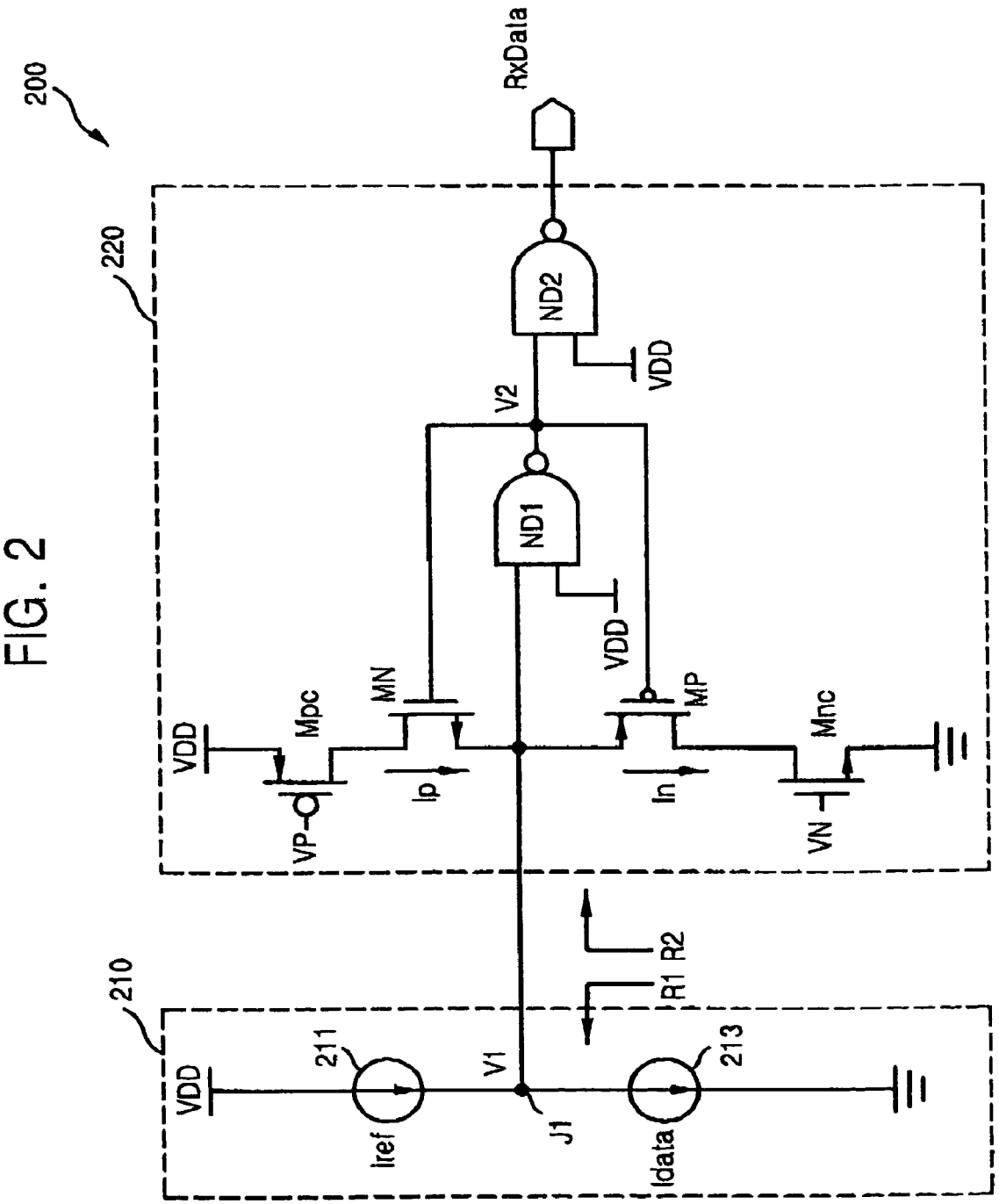
FIG. 2 is a circuit diagram of a current mode receiver, according to an example embodiment.

FIG. 2 is a circuit diagram of a current mode receiver according to an example embodiment. Referring to FIG. 2, a current mode receiver 200 may include a receiving end 210 and a comparator 220.

The receiving end 210 may be coupled to a voltage sensing node J1, may receive input current Idata, and may output a sensing voltage V1 according to a difference between the received input current Idata and reference current Iref. Thus, information corresponding to the difference between the input current Idata and the reference current Iref may be presented as a change in the voltage of the voltage sensing node J1.

The comparator 220 may be of a biased cascode type, and may include main transistors MN and MP, NAND gates ND1 and ND2, and cascode current sources Mpc and Mnc. Cascode current sources Mpc and Mnc may be respectively coupled to the main transistors MN and MP in a cascode form. Therefore, the arrangement of cascode current source Mpc and main transistor MN may be considered a cascode. Similarly, the arrangement of cascode current source Mnc and main transistor MP may be considered a cascode. However, other cascode arrangements could be used as well. For example, a cascode arrangement using more than one main transistor, or using a resistive network could be employed as well.

In an example embodiment, the main transistor MN may be embodied as an NMOS transistor that is turned on/off in response to an output signal V2 of the NAND gate ND1. A source of the main transistor MN may be coupled to the voltage sensing node J1 and a gate of the main transistor MN may receive the output signal V2 of the NAND gate ND1. In an example embodiment, the main transistor MP may be embodied as a PMOS transistor that is turned on/off in response to the output signal V2 of the NAND gate ND1. A source of the main transistor MP may be coupled to the voltage sensing node J1 and a gate of the main transistor MP may receive the output signal V2 of the NAND gate ND1.

In at least one example embodiment, the cascode current sources Mpc and Mnc may be respectively embodied as a PMOS transistor and an NMOS transistor. Thus, for the convenience of explanation, cascode current sources Mpc and Mnc may be referred to as cascode transistors. The cascode transistors Mpc and Mnc may be respectively coupled to the main transistors MN and MP in a cascode fashion, and may be controlled by bias voltages VP and VN. Bias voltages VP and VN may be DC voltages generated by a cascode bias circuit (e.g., 240 of FIG. 3). The cascode transistor Mpc may receive the bias voltage VP through a gate thereof. A source of the cascode transistor Mpc may be coupled to power VDD, and a drain of the cascode transistor Mpc may be coupled to a drain of the main transistor MN. The cascode transistor Mnc may receive the bias voltage VN through a gate thereof. A source of the cascode transistor Mnc may be coupled to ground, and a drain of the cascode transistor Mnc may be coupled to a drain of the main transistor MP. The input impedance R2 of the comparator 220, formed of the main transistor MN and the cascode transistor Mpc, may be calculated using Equation 2.

$$R2 = \frac{1}{g_{MN}}\left\{1 + \frac{R_L}{r_{OMN}}\right\} \approx \frac{2}{g_{MN}}, \text{ where } R_L = r_{OMpc} \quad \text{[Equation 2]}$$

In the above equation, R2 may be the input impedance of the comparator 220, $r_{OMN}$ may be the resistance of the main transistor MN, $R_L$ may be the output resistance $r_{OMpc}$ of the cascode transistor Mpc, and $g_{MN}$ may be the transconductance of the main transistor MN.

As shown in Equation 2, the input impedance R2 of the current mode comparator 220 may have a value increased by about twice compared with the input impedance (R2 of Equation 1) of the current mode comparator 120 according to conventional technology. Thus, as shown in Equation 3, the voltage swing level ΔV at the voltage sensing node J1 may double compared with conventional technology.

$$\Delta V \approx 2 \cdot \left( \frac{1}{g_{mn}} + \frac{1}{g_{mp}} \right) |I_{DATA} - I_{REF}|$$ [Equation 3]

Therefore, the SNR may double when a signal is transmitted at an equivalent current level and the consumption of current may be reduced to ½ for an equivalent SNR.

Also, because the cascode transistors Mpc and Mnc may provide a constant current source controlled by the bias voltages VP and VN, the amount of power noise induced at the voltage sensing node J1 may be reduced by about twice compared with conventional technology.

Figure 3:
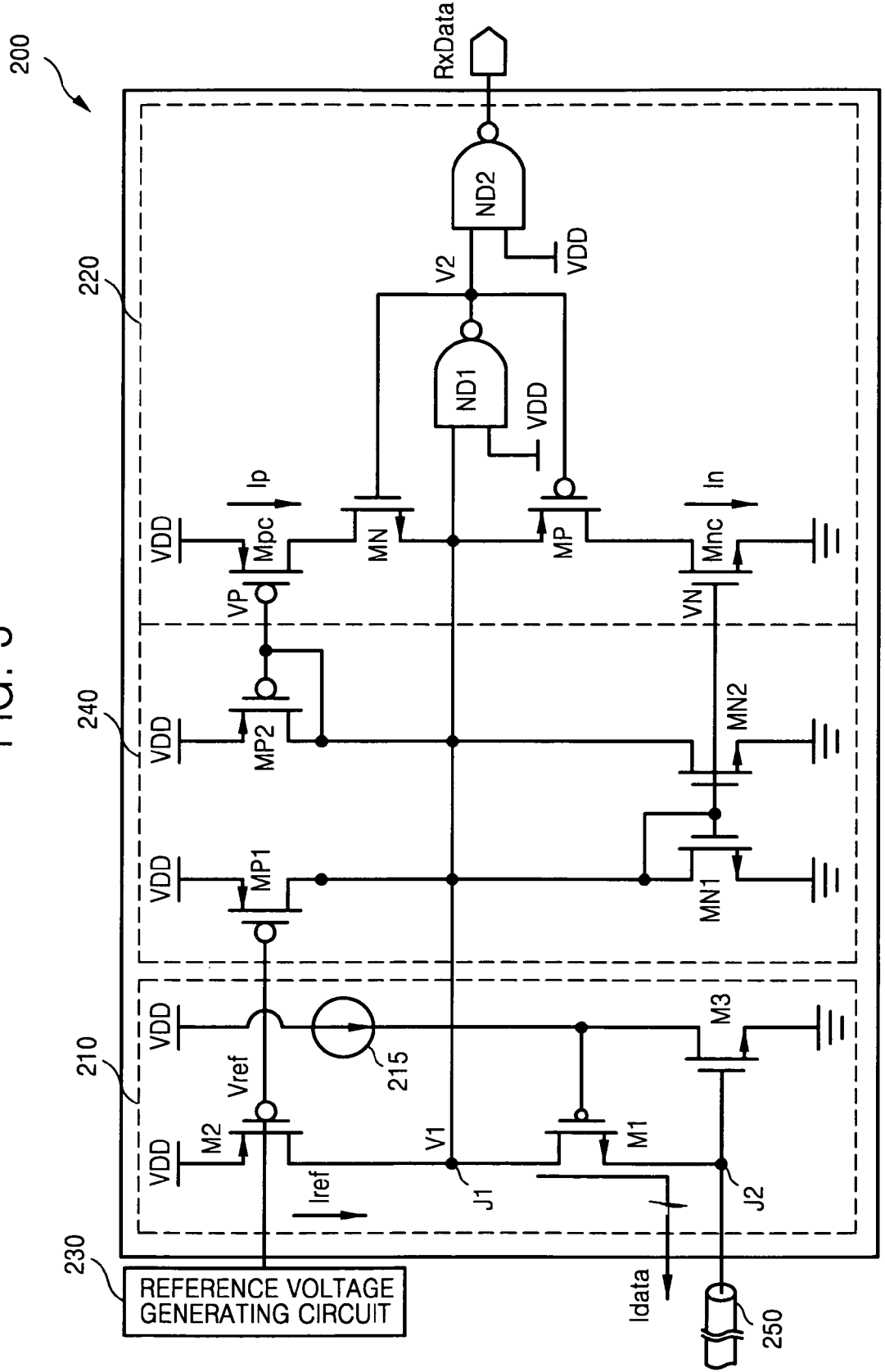
FIG. 3 is a circuit diagram showing the current mode receiver of FIG. 2 in detail, according to an example embodiment.

FIG. 3 is a circuit diagram showing the current mode receiver of FIG. 2 in detail, according to an example embodiment. The current mode receiver 200 may further include a reference voltage generating circuit 230 and a cascode bias circuit 240.

The reference voltage generating circuit 230 may generate a reference voltage Vref. Although not shown in FIG. 3, the reference voltage generating circuit 230 may generate the reference voltage Vref according to a reference current received externally. The reference voltage Vref may be used to generate the reference current Iref that may be equivalent to and/or based on the reference current received externally. The reference voltage Vref may be input to the cascode bias circuit 240 and may be used to generate the bias voltages VP and VN.

The receiving end 210 may include transistors M1-M3 and a current source 215. The transistor M1 may be coupled to another semiconductor device (e.g., a controller through a channel 250) and may receive input current Idata transmitted by the semiconductor device. That is, the transistor M1 may function as the current source (e.g., 213 of FIG. 2) that outputs input current Idata. The transistor M2 may function as the reference current source (e.g., 211 of FIG. 2) that generates the reference current Iref according to the reference voltage Vref output from the reference voltage generating circuit 230. The transistor M3 may function to reduce the resistance of the source of the transistor M1 by giving negative feedback to an input node J2. The current source 215 may supply a bias current to the transistor M3.

Since the structure of comparator 220 is described above with reference to FIG. 2, a description thereof will be omitted for the sake of brevity. The operation of the comparator 220, however, is described below.

The comparator 220 may convert the sensing voltage V1 at the voltage sensing node J1 to a CMOS level output signal RxData and may output the same. When the input current Idata is less than the reference current Iref, the sensing voltage V1 of the voltage sensing node J1 may become higher than a predetermined or desired voltage (e.g., VDD/2) such that the output voltage V2 of the NAND gate ND1 transitions to a low level and the output signal RxData transitions to a high level. Because the output voltage V2 of the NAND gate ND1 is a low level, the main transistor MN may be turned off and the main transistor MP may be turned on. In an example embodiment, the current In (a current as much as Iref minus Idata) may flow to ground via the main transistor MP. For example, because the current Ip and In flowing through the comparator 220 satisfy Equation 4, the bias voltage VN may be generated based on the reference voltage Vref of the reference voltage generating circuit 230.

$I_n = Iref - Idata, I_p = Idata - Iref$ [Equation 4]

In contrast, when the input current Idata is greater than the reference current Iref, the sensing voltage V1 of the voltage sensing node J1 may become lower than a predetermined or desired voltage (e.g., VDD/2) such that the output voltage V2 of the NAND gate ND1 transitions to a high level and the output signal RxData transitions to a low level. Because the output voltage V2 of the NAND gate ND1 is a high level, the main transistor MN may be turned on and the main transistor MP may be turned off. In an example embodiment, the current Ip (a current as much as Idata minus Iref) may be supplied to the voltage sensing node J1 via the NMOS transistor MN. The bias voltage VP may be generated from the reference voltage Vref of the reference voltage generating circuit 230.

The cascode bias circuit 240 may include PMOS transistors MP1 and MP2, and NMOS transistors MN1 and MN2. A gate of the PMOS transistor MP1 may receive the reference voltage Vref. When a ratio between the width/length (W/L) ratio of the transistor M2 of the receiving end 210 and the W/L ratio of the PMOS transistor MP1 is downsized to 1:1/n, the current flowing through the PMOS transistor MP1 and the NMOS transistor MN1 may become 1/n of the reference voltage Iref. That is, when the W/L ratio of the second transistor M2 of the receiving end 210 is 1, the W/L ratio of the PMOS transistor MP1 is 1/n. Thus, the consumption of power by the cascode bias circuit 240 may be reduced.

The PMOS transistor MP1 and the NMOS transistor MN1 may be connected in series such that the same current may flow there-through. The NMOS transistors MN1 and MN2 may be connected in the form of a current mirror. Thus, when the W/L ratios of NMOS transistors MN1 and MN2 are the same, the same amount of current may flow there-through.

The NMOS transistor MN2 and the PMOS transistor MP2 may be connected in series such that the same current may flow there-through. The current flowing through the PMOS transistor MP2 and the NMOS transistor MN2 may become 1/n of the reference current Iref. The W/L ratio of the NMOS transistors MN1 and MN2 and the W/L ratio of the PMOS transistor MP2 may be presented to be the same as the W/L ratio ("1") of the transistor M2 of the receiving end 210.

The PMOS transistor MP2 and the cascode transistor Mpc of the comparator 220 may be connected in the form of a current mirror. The NMOS transistor MN2 and the cascode transistor Mnc of the comparator 220 may also be connected in the form of a current mirror. In this instance, the W/L ratios of the cascode transistors Mpc and Mnc may be designed to satisfy Equation 4. When the W/L ratio of the cascode transistors Mpc and Mnc is assumed to be "m", the "m" may be determined such that the "m/n" of the reference voltage Iref is the same as [Iref minus Idata] or [Idata minus Iref].

Figure 4:
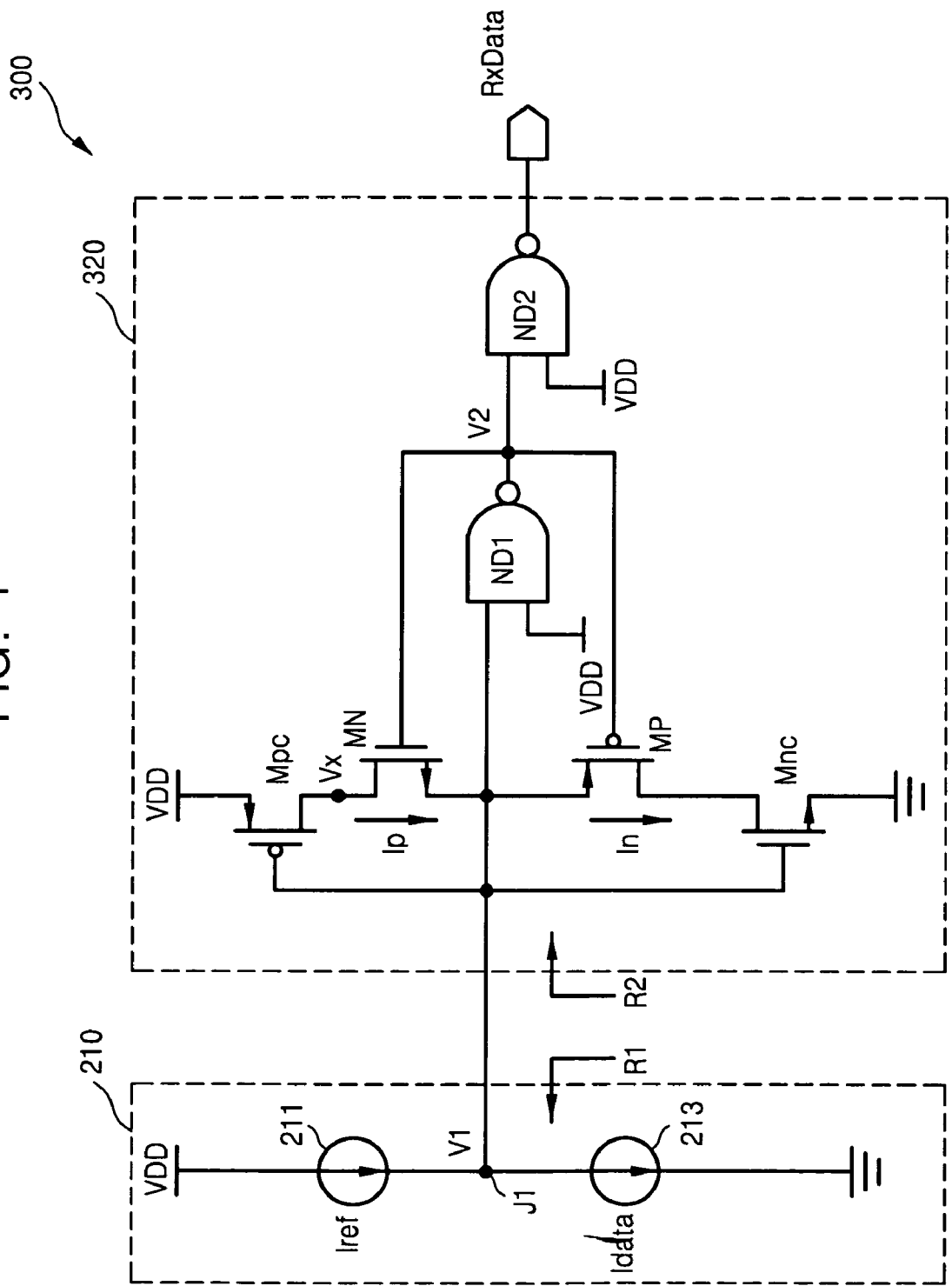
FIG. 4 is a circuit diagram of a current mode receiver, according to an example embodiment.
Figure 5:
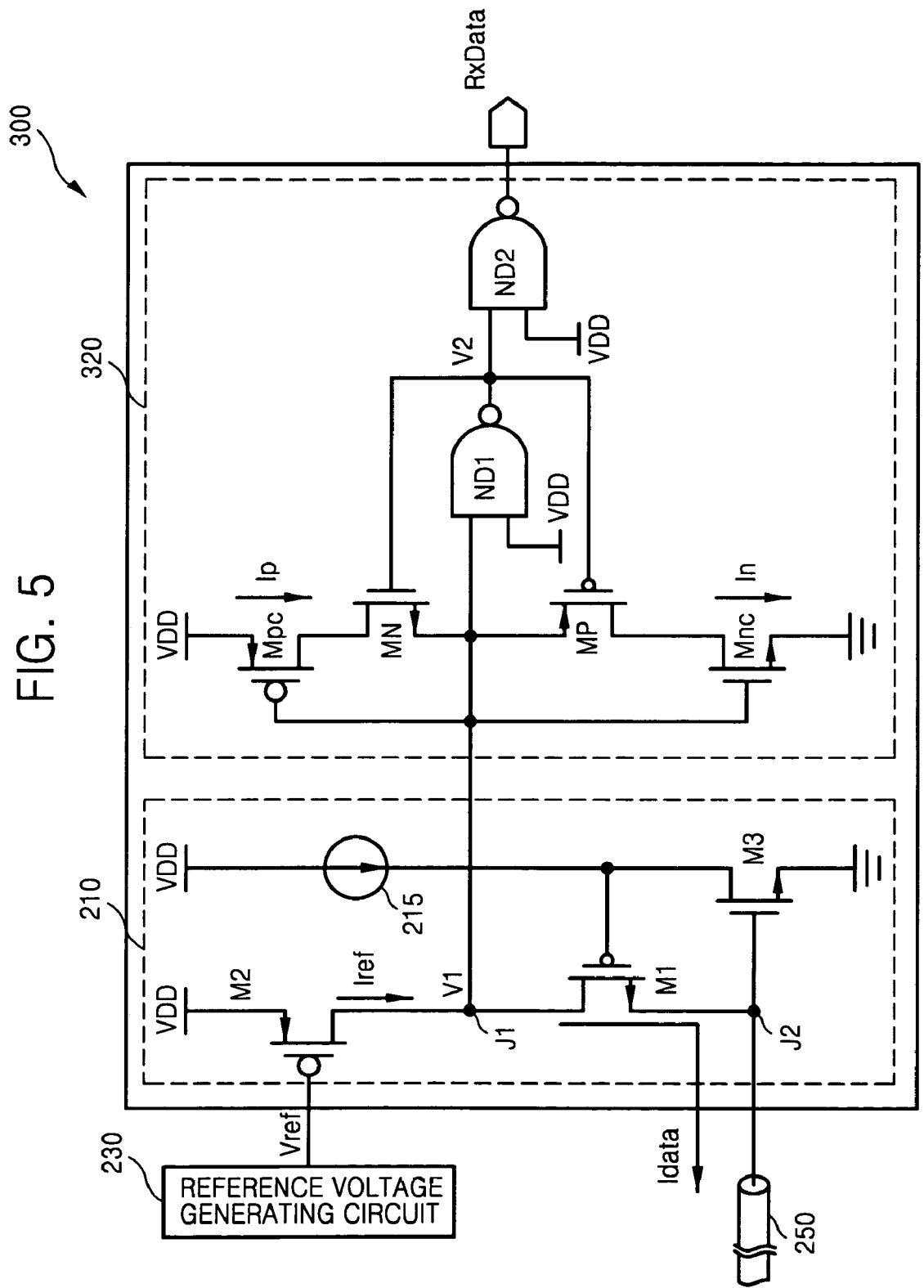
FIG. 5 is a circuit diagram showing the current mode receiver of FIG. 4 in detail, according to an example embodiment.

FIG. 4 is a circuit diagram of a current mode receiver 300, according to an example embodiment. FIG. 5 is a circuit diagram showing the current mode receiver 300 of FIG. 4 in detail, according to an example embodiment. Referring to FIGS. 4 and 5, the current mode receiver 300 may be a self-biasing type current mode receiver.

The current mode receiver 300 may include the reference voltage generating circuit 230, the receiving end 210, and/or a comparator 320. Because the current mode receiver 300 may be of a self-biasing type, there may be no need to include the cascode bias circuit 240 of FIG. 3.

The structures of the reference voltage generating circuit 230, the receiving end 210, and the comparator 320 may be similar to those of the reference voltage generating circuit 230, the receiving end 210, and the comparator 220 of the current mode receiver 200, according to example embodiments. However, although the additional bias voltages Vp and Vn are applied to the gates of cascode transistors Mpc and Mnc of the comparator 220 in the current mode receiver 200, the gates of the cascode transistors Mpc and Mnc of the comparator 320 may be coupled to the voltage sensing node J1 in the current mode receiver 300, according to an example embodiment.

Thus, the cascode transistors Mpc and Mnc may control the current Ip and In flowing through the comparator 320 using the sensing voltage V1. Because the current Ip and In flowing through the comparator 320 satisfy Equation 4, the size (W/L ratio) of the cascode transistors Mpc and Mnc may be determined such that a current of [Iref minus Idata] or [Idata minus Iref] may flow.

The NAND gate ND1, the first main transistor MN, and the cascode transistor Mpc, may form a negative feedback loop with respect to the voltage sensing node J1, and may control the transistors forming a cascode structure (e.g. the main transistor MN and the cascode transistor Mpc) to operate in the saturation region. The NAND gate ND1, the main transistor MP, and the cascode transistor Mnc, may form a negative feedback loop with respect to the voltage sensing node J1, and may control the transistors forming a cascode structure (e.g. the main transistor MP and the cascode transistor Mnc) to operate in the saturation region.

The conditions for the operation of the main transistor MN and the cascode transistor Mpc in the saturation region are shown in Equation 5.

$$V2-Vthn<Vx<V1+|Vthp|$$ [Equation 5]

In Equation 5, Vthn and Vthp may be threshold voltages of the main transistor MN and the cascode transistor Mpc, respectively.

The input impedance R2 of the comparator 320 may be as shown in Equation 2. Thus, the voltage swing level ΔV of the voltage sensing node J1 may be as shown in Equation 3. Thus, as in the current mode receiver 200, the voltage swing level ΔV of the voltage sensing node J1 may double compared with conventional technology such that the SNR is improved and the consumption of current may be reduced to about ½. Also, because the cascode transistors Mpc and Mnc may provide a constant current source, the amount of power noise induced at the voltage sensing node J1 may be reduced by about twice compared with conventional technology.

Because the current mode receiver 300 of a self-biasing type does not require an additional bias circuit for the cascode current sources Mpc and Mnc, noise immunity may be improved without a great increase in size and power consumption.

A semiconductor device, according to an example embodiment, may include as many (or more) of the current mode receiver 200 or 300 as the number of channels included in the semiconductor device. That is, the semiconductor device may include a plurality of current mode receivers that receive an input current from one of a plurality of channels corresponding to the receivers, and generate output signals. The receiving end 210 and the current mode comparator 220 or 320 may be provided for each channel, while the reference voltage generating circuit 230 and the cascode bias circuit 240 may be commonly used for each channel.

As described above, the current mode comparator according to example embodiments may employ a cascode structure such that the output resistance may be increased and the PSRR characteristics may be improved. Also, by doubling the SNR of the comparator by increasing the input resistance of the voltage sensing node, noise immunity may be enhanced.

As described above, according to example embodiments, the voltage swing level and the PSRR may increase. Therefore, the detection of a signal in a system having a low current level may be relatively simpler. Also, noise immunity may be enhanced such that the SNR is improved. Therefore, an error rate of a received signal may also be reduced.

With some example embodiments having thus been described, it will be obvious that the same may be varied in many ways. Such variations are not to be regarded as a departure from the spirit and scope of example embodiments, and all such modifications are intended to be included within the scope thereof.

What is claimed is:

1. A current mode comparator comprising:
a logic circuit coupled to a voltage sensing node, the logic circuit converting a voltage of the voltage sensing node to an output signal;
a first cascode coupled to the voltage sensing node and a first power node; and
a second cascode coupled to the voltage sensing node and a second power node,
wherein the first cascode and the second cascode are turned on and/or off based on the output signal.

2. The current mode comparator of claim 1, wherein the output signal is a CMOS level output signal.

3. The current mode comparator of claim 1, wherein the output signal reflects a difference between a reference current and a data current.

4. The current mode comparator of claim 1, wherein the logic circuit is a CMOS logic circuit.

5. The current mode comparator of claim 4, wherein the CMOS logic circuit includes at least two NAND gates, the output of one of the at least two NAND gates providing the output signal.

6. The current mode comparator of claim 1, wherein:
the first cascode supplies a first current from the first power node to the voltage sensing node; and
the second cascode supplies a second current from the voltage sensing node to the second power node.

7. The current mode comparator of claim 6, wherein:
the first current is equivalent to the difference between a data current and a reference current; and
the second current is equivalent to the difference between the reference current and the data current.

8. The current mode comparator of claim 1, wherein:
the first cascode includes a first cascode current source and a first main transistor; and
the second cascode includes a second cascode current source and a second main transistor.

9. The current mode comparator of claim 8, wherein:
the first cascode current source includes a PMOS transistor having a first terminal coupled to the first main transistor and a second terminal coupled to the voltage sensing node; and
the second cascode current source includes an NMOS transistor having a first terminal coupled to the second main transistor and a second terminal coupled to the voltage sensing node.

10. The current mode comparator of claim 8, wherein:
the first cascode current source includes a PMOS transistor having a first terminal coupled to the first main transistor and a second terminal receiving a first bias voltage; and
the second cascode current source includes an NMOS transistor having a first terminal coupled to the second main transistor and a second terminal receiving a second bias voltage.

11. A current mode receiver comprising:
the current mode comparator of claim 1; and
a signal receiving end coupled to the voltage sensing node.

12. The current mode receiver of claim 11 wherein the signal receiving end receives a reference current and a data current, and generates a sensing voltage based on a difference between the reference current and the data current.

13. The current mode receiver of claim 11 wherein the signal receiving end receives a reference voltage and a data current, generates a reference current from the reference voltage, and generates a sensing voltage based on a difference between the reference current and the data current.

14. The current mode receiver of claim 11, further comprising:
   a reference voltage generating circuit generating a reference voltage; and
   a cascode bias circuit generating a first bias voltage and a second bias voltage.

15. The current mode receiver of claim 14, wherein:
   the first cascode includes a PMOS transistor having a first terminal coupled to a first main transistor and a second terminal receiving the first bias voltage; and
   the second cascode includes an NMOS transistor having a first terminal coupled to a second main transistor and a second terminal receiving the second bias voltage.

16. The current mode receiver of claim 14, wherein:
   the cascode bias circuit generates a first bias current corresponding to 1/n of the reference current in response to the reference voltage, where n is a real number greater than 1;
   the cascode bias circuit generates the first bias voltage such that a current from the first cascode corresponds to m/n of the first bias current;
   the cascode bias circuit generates the second bias voltage such that a current from the second cascode corresponds to m/n of the first bias current;
   m is the W/L ratio of a cascode transistor of the first cascode; and
   n is a real number greater than 1.

17. A semiconductor device comprising a plurality of the current mode receivers of claim 11.

18. The semiconductor device of claim 17, wherein the signal receiving end receives a reference current and a data current, and generates a sensing voltage based on a difference between the reference current and the data current.

19. The semiconductor device of claim 17, wherein the signal receiving end receives a reference voltage and a data current, generates a reference current from the reference voltage, and generates a sensing voltage based on a difference between the reference current and the data current.

20. The semiconductor device of claim 17, further comprising:
   at least one reference voltage generating circuit generating a reference voltage, the signal receiving end receiving the reference voltage.

* * * * *